(12) United States Patent
Doerrer (10) Patent No.: US 7,983,640 B2
(45) Date of Patent: Jul. 19, 2011

(54) RECEIVER CIRCUIT

(75) Inventor: Lukas Doerrer, Villach (AT)

(73) Assignee: Infineon Technologies AG, Munich (DE)

( * ) Notice: Subject to any disclaimer, the term of this patent is extended or adjusted under 35 U.S.C. 154(b) by 537 days.

(21) Appl. No.: 11/645,002

(22) Filed: Dec. 22, 2006

(65) Prior Publication Data

US 2007/0207762 A1    Sep. 6, 2007

(30) Foreign Application Priority Data

Dec. 23, 2005    (DE) .......................... 10 2005 061 813

(51) Int. Cl.
| | |
|---|---|
| H04B 1/06 | (2006.01) |
| H04M 3/00 | (2006.01) |
| H04M 1/66 | (2006.01) |

(52) U.S. Cl. ........ 455/230; 455/254; 455/307; 341/143; 341/144; 341/155

(58) Field of Classification Search .................. 455/230, 455/254, 334, 303, 306, 307; 341/110, 144, 341/155, 143

See application file for complete search history.

(56) References Cited

U.S. PATENT DOCUMENTS

| | | | | |
|---|---|---|---|---|
| 6,271,782 | B1 * | 8/2001 | Steensgaard-Madsen | 341/143 |
| 7,057,540 | B2 * | 6/2006 | Muhammad et al. | 341/143 |
| 7,183,955 | B1 * | 2/2007 | Shih | 341/143 |
| 7,190,296 | B2 * | 3/2007 | Gupta | 341/143 |
| 7,249,008 | B2 * | 7/2007 | Jelonnek et al. | 703/2 |
| 7,482,852 | B1 * | 1/2009 | Samavati | 327/359 |
| 7,561,635 | B2 * | 7/2009 | Norsworthy et al. | 375/295 |
| 2003/0067404 | A1 * | 4/2003 | Ruha et al. | 341/143 |
| 2005/0270201 | A1 * | 12/2005 | Maloberti et al. | 341/143 |
| 2006/0111074 | A1 * | 5/2006 | Petilli et al. | 455/334 |

FOREIGN PATENT DOCUMENTS

| | | |
|---|---|---|
| DE | 19831369 A1 | 1/2000 |
| DE | 101 03 811 A1 | 8/2002 |
| WO | WO 2005/027339 A1 | 3/2005 |

OTHER PUBLICATIONS

Schreier, R. et al. "A Flexible 10-300 MHz Receiver IC Employing a Bandpass Sigma-Delta ADC." IEEE Radio Frequency Integrated Circuits Symposium. Phoenix, AZ. May 20-22, 2001. (4 Pages).

Breems, L. J. et al."A 1.8-mW CMOS ΣΔ Modulator with Integrated Mixer for A/D Conversion of IF Signals." *IEEE Journal of Solid-State Circuits*. vol. 35. Apr. 2000: pp. 468-475. (8 pages).

(Continued)

*Primary Examiner* — Duc M Nguyen
(74) *Attorney, Agent, or Firm* — Maginot, Moore & Beck (57) ABSTRACT

A receiver circuit for receiving an analog signal comprises a mixer device, a first integrator device coupled to the mixer device, a second integrator device following the first integrator device, a quantizer device, and first and second feedback digital/analog converters. The mixer device mixes the analog signal with a local-oscillator frequency and outputs a mixer current signal. The first integrator device generates a first intermediate signal by integrating the mixer current signal summed with a first feedback current signal, the second integrator device generates a quantizer input signal by integrating the first intermediate signal summed with a second feedback current signal, and the quantizer device generates a digital output signal by quantizing the quantizer input signal. The first feedback digital/analog converter converts the digital output signal into the first feedback current signal and the second feedback digital/analog converter converts the digital output signal into the second feedback current signal.

15 Claims, 5 Drawing Sheets

OTHER PUBLICATIONS

Breems, Lucien et al. "Continuous-Time Sigma-Delta Modulation for A/D Conversion in Radio Receivers." Chapter 4.4. Kluwer Academic Publishers, Sep. 2001.ISBN 0792374924. (18 Pages).

Tietze und Schenk: Halbleiter-Schaltungstechnik 9. Autlage. Berlin: Springer, 1989, S. 9-12; ISBN 3-540-19475-4.

Cherry, Snelgrove: Continous-Time Delta-Sigma Modulators for High-Speed AID Conversions. Ist Edition, 2nd printing. Dordrecht, Netherlands: Kluwer Academics, 2002. S. 7-12. ISBN 0-7923-8625-6.

* cited by examiner

RECEIVER CIRCUIT

FIELD OF THE INVENTION

The present invention relates to a receiver circuit for receiving an analog signal and for outputting a digital output signal.

BACKGROUND OF THE INVENTION

In modern wireless transmission systems such as, for example, DECT, GSM, EDGE, IS95, WCDMA 2000, integrated circuits are required which reliably convert a received analog signal into a digital signal which can be processed further.

Figure 1:
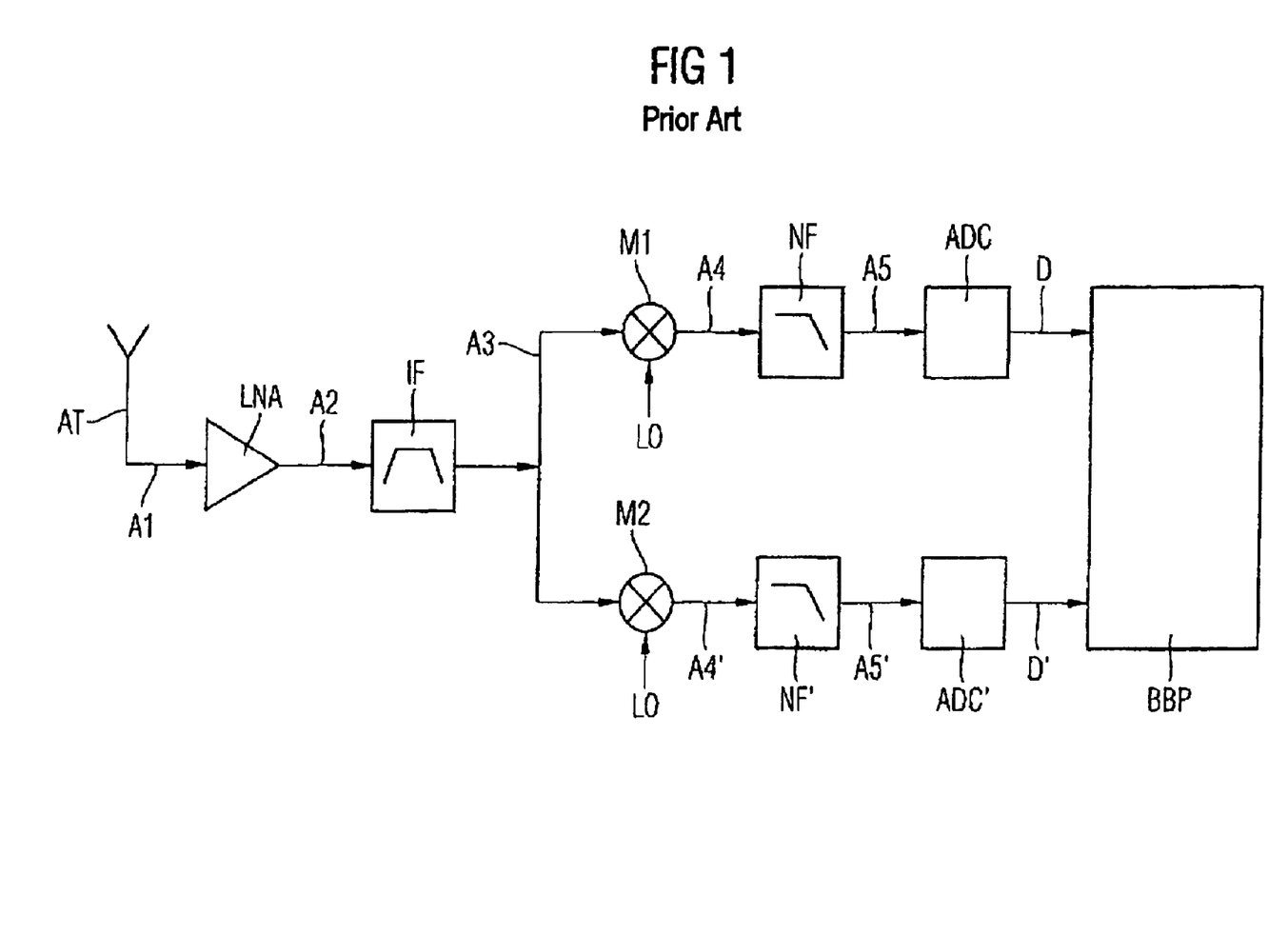
FIG. 1, as described above, is a diagrammatic representation of a receiver arrangement.

FIG. 1 diagrammatically shows the components of a conventional receiver arrangement. An antenna AT receives an emitted signal and delivers an antenna signal A1 to a preamplifier LNA (low noise amplifier) which provides a preamplified signal A2. An input filter IF usually arranged as bandpass filter, filters the preamplified antenna signal A2 and delivers a filtered received analog signal A3 to a mixer device M1, M2 which in each case mixes the filtered received signal A3 with the local-oscillator frequency LO and outputs a respective mixer current signal A4, A4'. FIG. 1 shows an upper mixer branch M1 and a lower mixer branch M2, the mixed signals in each case being phase shifted by 90°.

The mixer is followed by an adjacent-channel filter NF, NF' which is usually arranged as a low-pass filter, for example as a fourth- or fifth-order Butterworth filter. The adjacent-channel filter essentially prevents the received signal A4 mixed with the local-oscillator frequency LO from being interfered with by adjacent channels or frequencies.

The received signal A5, A5' filtered in this manner is in each case converted by an analog/digital converter ADC, ADC' into a digital signal D, D' which can be processed further in a baseband processor BBP and which reconstructs the corresponding transmitted digital data. When individual circuits are used for mixers, adjacent-channel filters and analog/digital converters, a number of disadvantages occur.

A conventional mixer has, for example, an amplifier, a switch device and a current/voltage converter. In this arrangement, the radio-frequency signal to be mixed is amplified and mixed by a switch device switched by the respective local-oscillator frequency. Following this, a current/voltage conversion is required in order to generate a mixed output voltage signal.

In this process, a normally used current/voltage conversion is effected via an operational amplifier which, at the same time, performs signal filtering by means of a feedback resistor and a parallel-connected capacitor. The corresponding feedback capacitors suppress a transmission of the radio-frequency input signal into the output signal of the respective operational amplifier. However, the feedback resistance value defines the gain of the mixer and the gain must only be adjusted moderately since otherwise the mixer output signal would be limited. However, a small resistance value increases the corresponding filtering bandwidth, since in an operational amplifier with capacitive and resistive feedback, the corresponding bandwidth is $f_{bw} \alpha \ \frac{1}{2}\pi \cdot C \cdot R$, where R and C are the values of the corresponding feedback resistors and capacitors. A small resistance thus increases the correspondingly needed feedback capacitance and thus the area required by such a circuit on a semiconductor chip. For GSM applications, for example, the filter bandwidth should be about 100 kHz. With feedback resistances $R \approx 1$ kOhm, a large capacitance of $C=100$ pF–10 nF is thus necessary which requires a large area on the corresponding semiconductor chip and increases the current consumption of the mixer device.

Before the correspondingly mixed analog signal is conducted to an analog/digital converter, adjacent-channel signals must be reliably suppressed. To combine corresponding filtering with the analog/digital conversion, it has been proposed in the past to use time-continuous sigma/delta (analog/digital) converters.

In the sigma/delta conversion, a feedback signal is subtracted from an analog input signal to be converted and the resultant signal is first subjected to filtering, in most cases to an integration and is then quantized. The quantized digital output signal obtained in this manner is converted by a feedback-type digital/analog converter and used as feedback signal. The digital output signal of the quantizer, for example, mainly supplies a High level with a rising analog input signal, a Low level with a falling analog input signal and alternating High and Low levels with an essentially constant analog input signal. Simple digital integrating then supplies the digital signal value from the output signal.

One advantage of time-continuous filtering or integrating in the sigma/delta converter consists, in particular, in that an inherent filter function of the corresponding analog/digital converter exists. Between the input of a continuous sigma/delta converter and the quantizing input of the sigma/delta converter, an anti-aliasing filter frequently of a higher order is implemented, therefore, which can be used as adjacent-channel filter when the sigma/delta converter is used in a receiver circuit.

In chapter 4.4. in L. Breems, J. H. Huijsing: "Continuous-Time Sigma-Delta Modulation for A/D Conversion in Radio Receivers", Kluwer Academic Publishers, 2001, ISBN 0792374924, for example, the combination of a mixer with a sigma/delta converter is presented.

Figure 2:
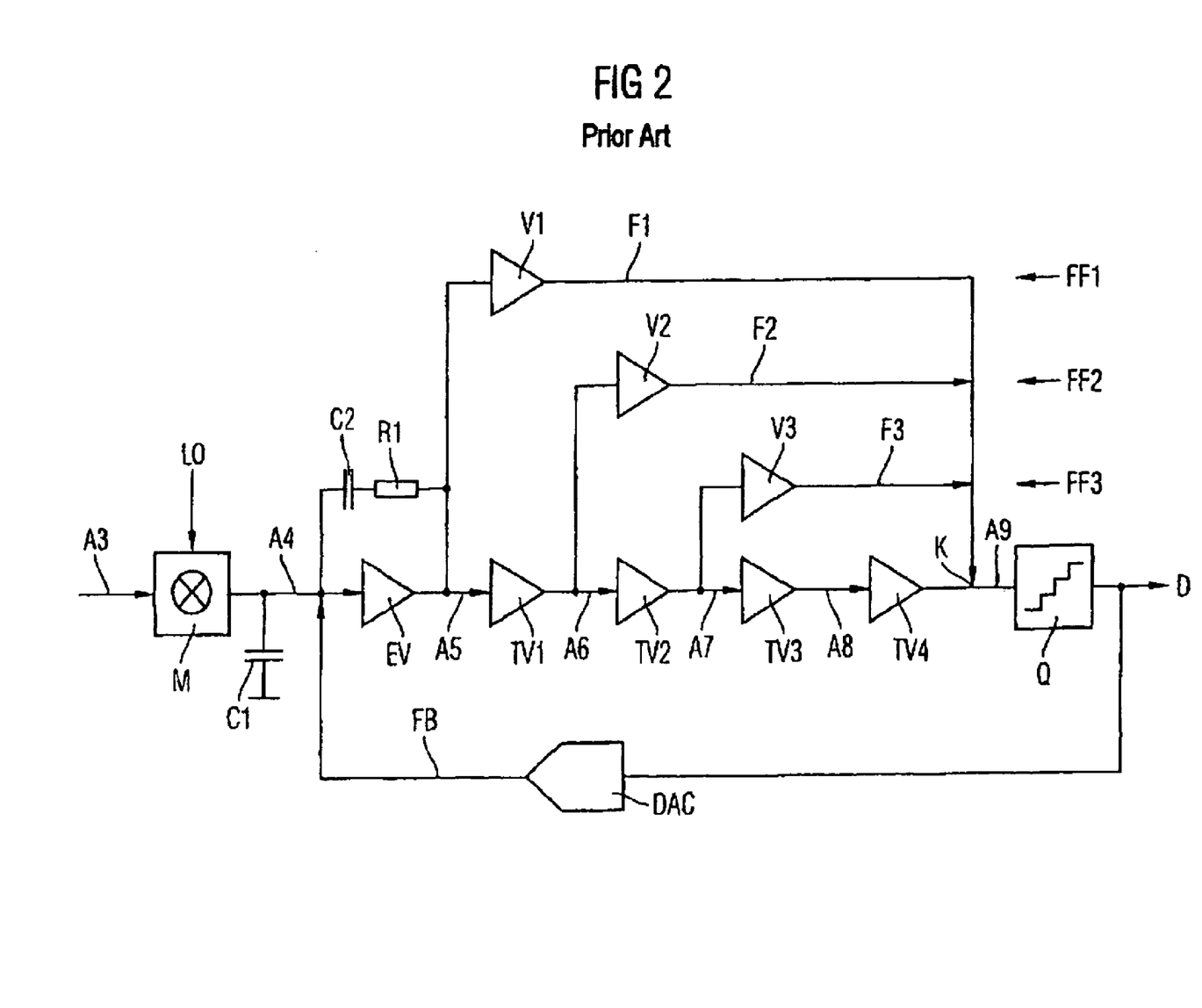
FIG. 2, as described above, is a receiver circuit with feed forward.

FIG. 2 shows a corresponding diagrammatic representation of such a receiver arrangement. At the input end, a mixer M is provided which is supplied with the received analog signal A3 and which carries out mixing with the local-oscillator frequency LO. At the output of the mixer, a capacitor C1 is provided which ensures that the received radio-frequency signal A3 is decoupled. The value of this capacitor C1 must be selected to be high in order to achieve good decoupling. From the output current signal A4 of the mixer M, the feedback signal FB is subtracted which is supplied by a feedback digital/analog converter DAC. The input stage of a voltage-amplifying operational amplifier EV and a serial feedback loop of a resistor R1 and a capacitor C2 acts as integrator. The corresponding analog integrated signal A5 is supplied to a serial chain of transconductance integrators TV1, TV2, TV3, TV4. Between the transconductance integrators TV1, TV2, TV3, TV4, corresponding intermediate signals A5, A6, A7, A8 are picked up and weighted by transconductance amplifiers V1, V2, V3 in forward coupling loops FF1, FF2, FF3. The corresponding forward coupling signals F1, F2, F3 are combined with the signal A9 passing through the integrator chain TV1, TV2, TV3, TV4 at a node K located before the quantizer Q. The quantizer Q finally supplies the digital output signal D which is also supplied to the feedback digital/analog converter.

In the receiver circuit shown in FIG. 2, a signal path without further filtering is always obtained between the first integrator EV, R1, C2 and the input of the quantizer Q. This is the first feed forward branch FF1. Since the mixer M preceding the sigma/delta converter arrangement is present at the input of the integrator EV, R1, C2 and the corresponding signal A4 on the signal path is only subjected to first-order filtering, the input of the sigma/delta arrangement is sensitive to interference signals from the received signal A3.

BRIEF SUMMARY OF THE INVENTION

A first embodiment of the invention includes a receiver circuit for receiving an analog signal. The receiver circuit includes a mixer device, plurality integator devices, plural feedback digital/analog converters, and a quantizer. The mixer device mixes a received analog signal with a local-oscillator frequency and outputs a mixer current signal. A first integrator device is coupled to the mixer device and integrates the mixer current signal summed with a first feedback current signal to form a first intermediate signal. A second integrator device follows the first integrator device and integrates the first intermediate signal summed with a second feedback current signal to form a quantizer input signal. The quantizer device quantizes the quantizer input signal to form a digital output signal. A first feedback digital/analog converter converts the output signal into the first feedback current signal. A second feedback digital/analog converter converts the output signal into the second feedback current signal.

A second embodiment of the invention is an arrangement configured to receive an analog signal that includes a mixer device, a quantizer device, and one or more signal paths between the mixer device and the quantizer device. The mixer device is configured to mix said analog signal with a local-oscillator frequency and to output a mixer current signal. The quantizer device is configured to generate a digital output signal by quantizing said quantizer input signal. Each of the one or more signal paths is configured to provide at least second order filtering.

The features and advantages of embodiments of the invention will become more readily apparent to those of ordinary skill in the art by reference to the following detailed description and accompanying drawings.

BRIEF DESCRIPTION OF THE SEVERAL VIEWS OF THE DRAWINGS

Further advantageous embodiments of the inventive receiver circuit are the subject matter of the claims and of the illustrative embodiments described in the text which follows. In the text which follows, the invention will be explained in greater detail by way of example by means of preferred embodiments and referring to the figures, in which:

DETAILED DESCRIPTION OF THE INVENTION

In the figures, identical or functionally identical elements have been provided with the same reference symbol unless otherwise specified.

As discussed above, a first embodiment of the invention includes a receiver circuit for receiving an analog signal. The receiver circuit includes a mixer device, plurality integator devices, plural feedback digital/analog converters, and a quantizer. The mixer device mixes a received analog signal with a local-oscillator frequency and outputs a mixer current signal. A first integrator device is coupled to the mixer device and integrates the mixer current signal summed with a first feedback current signal to form a first intermediate signal. A second integrator device follows the first integrator device and integrates the first intermediate signal summed with a second feedback current signal to form a quantizer input signal. The quantizer device quantizes the quantizer input signal to form a digital output signal. A first feedback digital/analog converter converts the output signal into the first feedback current signal. A second feedback digital/analog converter converts the output signal into the second feedback current signal.

Due to the two feedback signals fed back and digital/analog converted, the receiver circuit according to the invention always provides filtering at least of the second order for a signal path between an output of the mixer device and an input of the quantizer device. As a result, the sigma/delta converter formed from the integrator devices, the quantizer device and the feedback digital/analog converters is distinctly more rugged with respect to interference in the mixer current signal than a configuration with feed forward arrangements. Due to the at least second order, an improved filtering effect is also given so that adjacent-channel filtering becomes more efficient. Decoupling the radio-frequency components from the received analog signal by means of a capacitor with a large capacitance is not necessary in the receiver circuit according to the invention. Instead, the circuit section forming the sigma/delta converter is also relatively insensitive to parasitic capacitances occurring at the mixer output. Thus, the receiver circuit according to the invention has the advantage that any decoupling capacitances which may be present have hardly any influence on the stability of the control loop of the sigma/delta modulator.

In the further description of the invention, intermediate signal is only understood to be signals which occur between the input and the output of the receiver circuit without establishing a relationship to an intermediate frequency in the sense of the differential frequency between received frequency and local-oscillator frequency.

At least one feedback digital/analog converter may preferably be followed by a weighting device which weights the respective feedback signal with a weighting factor. For example, amplifiers can be used for this purpose. The weighting factors are advantageously adjusted in such a manner that the receiver circuit performs a predetermined filtering of the received signal. The weighting factors can be used for essentially freely determining the filter transfer function of the inherent anti-aliasing filter of the sigma/delta arrangement. The adjacent-channel filtering which must be performed by a separate filter in the prior art can thus be performed in a resource-saving manner in the receiver circuit according to the invention.

In one embodiment of the inventive receiver circuit, further integrator devices, feedback digital/analog converters and/or weighting devices are provided. In this arrangement, the further integrator devices are connected serially between the first integrator device and the second integrator device. A respective further integrator device integrates an intermediate signal, which is generated by an integrator device preceding the respective further integrator device and which is summed with an associated further feedback current signal. In this arrangement, the respective further feedback current signal is generated from the digital output signal by an associated further feedback digital/analog converter. These further feedback loops provided in a feedback structure enable adjacent-channel filter functions of a higher order to be achieved.

At least one feed forward loop with a feed forward weighting device may furthermore be provided, wherein the feed forward weighting device weights an intermediate signal of an integrator device and the weight of the intermediate signal is added to the quantizer input signal.

The quantizer device and the feedback digital/analog converters may be arranged as multi-bit quantizer and multi-bit analog converter. The mixer device may preceded by a preamplifier which preamplifies the received analog signal. The preamplifier may then be preceded by a receiving means, particularly an antenna.

In another embodiment of the inventive receiver circuit, a device for dynamic element balancing precedes at least one of the feedback digital/analog converters. This allows the linearity characteristic of the sigma/delta converter to be improved further.

In a preferred illustrative embodiment, at least one integrator device has an operational amplifier with a feedback capacitor. Furthermore, at least one local resonator loop is also formed, wherein at least two serially interconnected integrator devices are provided with feedback via a resistor.

The receiver circuit may be constructed to be completely differential.

The quantizer input signal, before being coupled into the quantizer device, may preferably be supplied to a filter device which, in particular, may be constructed as an integrator. The second integrator device which, at its input, integrates a feedback current signal and an output signal of an integrator device arranged previously on the signal path, can thus be arranged at any point between the output of the first integrator device and the input of the quantizer device. According to the invention, however, at least two feedback loops are provided in the circuit section of the sigma/delta converter, wherein the respective feedback currents can be coupled into the filter path at any points.

Figure 3:
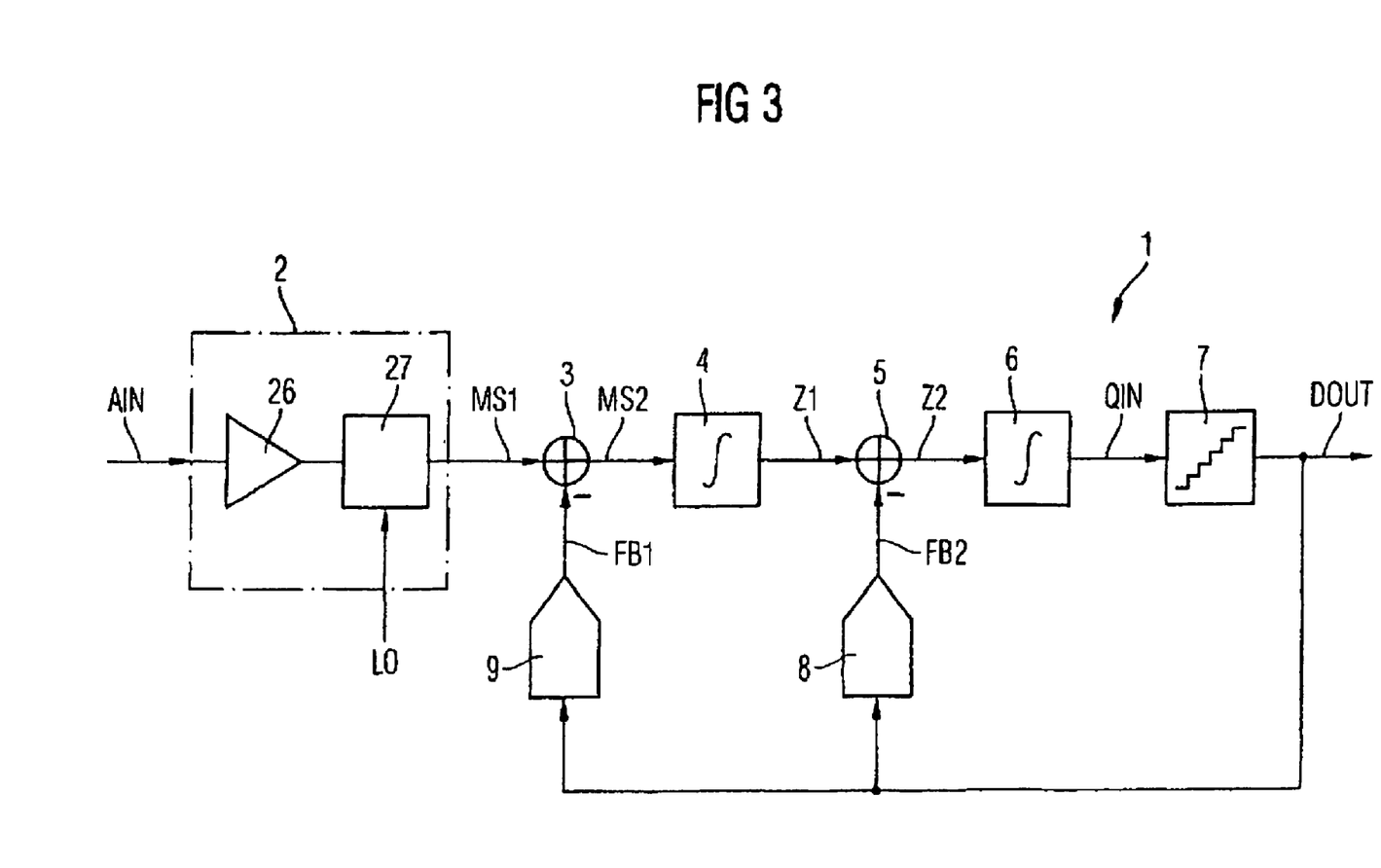
FIG. 3 is a diagrammatic representation of an exemplary embodiment of an inventive receiver circuit.

FIG. 3 shows a diagrammatic representation of the receiver circuit 1 according to the invention. A mixer 2 is provided which is supplied with a received analog signal AIN and which mixes this with a local-oscillator frequency LO to form a mixer current signal MS1. The mixer device has an input amplifier 26 and a switching device controlled by the local oscillator signal or the local-oscillator frequency LO, respectively. The mixer output is connected directly to the switching device 27 without any further filtering taking place in the mixer device 2. From the mixer current signal MS1, a first feedback current signal FB1 is subtracted via an adder device 3.

The analog signal MS2 thus obtained is supplied to a first integrator device 4 which integrates and outputs a first intermediate signal Z1. From the first intermediate signal Z1, a second feedback current signal FB2 is subtracted via a second adder device 5 and supplied as second intermediate signal Z2 to a second integrator device 6. The integrator device 6 integrates the second intermediate signal Z2 and supplies a quantizer input signal QIN. A quantizer 7 quantizes the quantizer input signal QIN to form the digital output signal DOUT. A first feedback digital/analog converter 9, which generates the first feedback current signal FB1 from the digital output signal DOUT, is provided as feedback loop. A second feedback digital/analog converter 8 converts the digital output signal into the second feedback current signal FB2 in such a manner.

According to the invention, no additional current/voltage converter is provided in the mixer device since the first integrator stage or the first integrator device 4 of the sigma/delta converter can process a current signal. This makes it possible, for example, to do without a feedback resistor for an operational amplifier provided in an output stage of the mixer device as a result of which the receiver circuit according to the invention can be constructed in a distinctly more space-saving manner on a semiconductor chip. Neither are any resistors required between the output of the mixer 2 and the first integrator 4. According to the invention, a current/voltage converter used in conventional mixers is no longer necessary and has been virtually relocated in the sigma/delta converter loop. The function which is otherwise necessary is handled by the first integrator device. Whereas a conventional mixer requires an operational amplifier with feedback resistors and capacitors preceding its output in order to ensure filtering, only capacitors need to be provided in the integrator devices of the invention. The receiver circuit 1 proposed according to the invention thus has a distinctly reduced space requirement on a semiconductor chip. A receiver circuit according to the invention can thus be integrated more simply and more advantageously.

Compared with a low-pass filter in mixer devices of the prior art, the integrator devices of the circuit section forming a sigma/delta are used according to the invention. The integrator device 4, as a rule, has a higher gain than a conventional low-pass filter as a result of which the noise sensitivity of the receiver circuit 1 is improved. Integrating an adjacent-channel filter in the form of the anti-aliasing filter for the sigma/delta converter provides additional savings in area. Compared with feed forward arrangements, the feedback performed by the two feedback digital/analog converters according to the invention is much more insensitive to a parasitic capacitance at the output of the mixer device 2.

Figure 4:
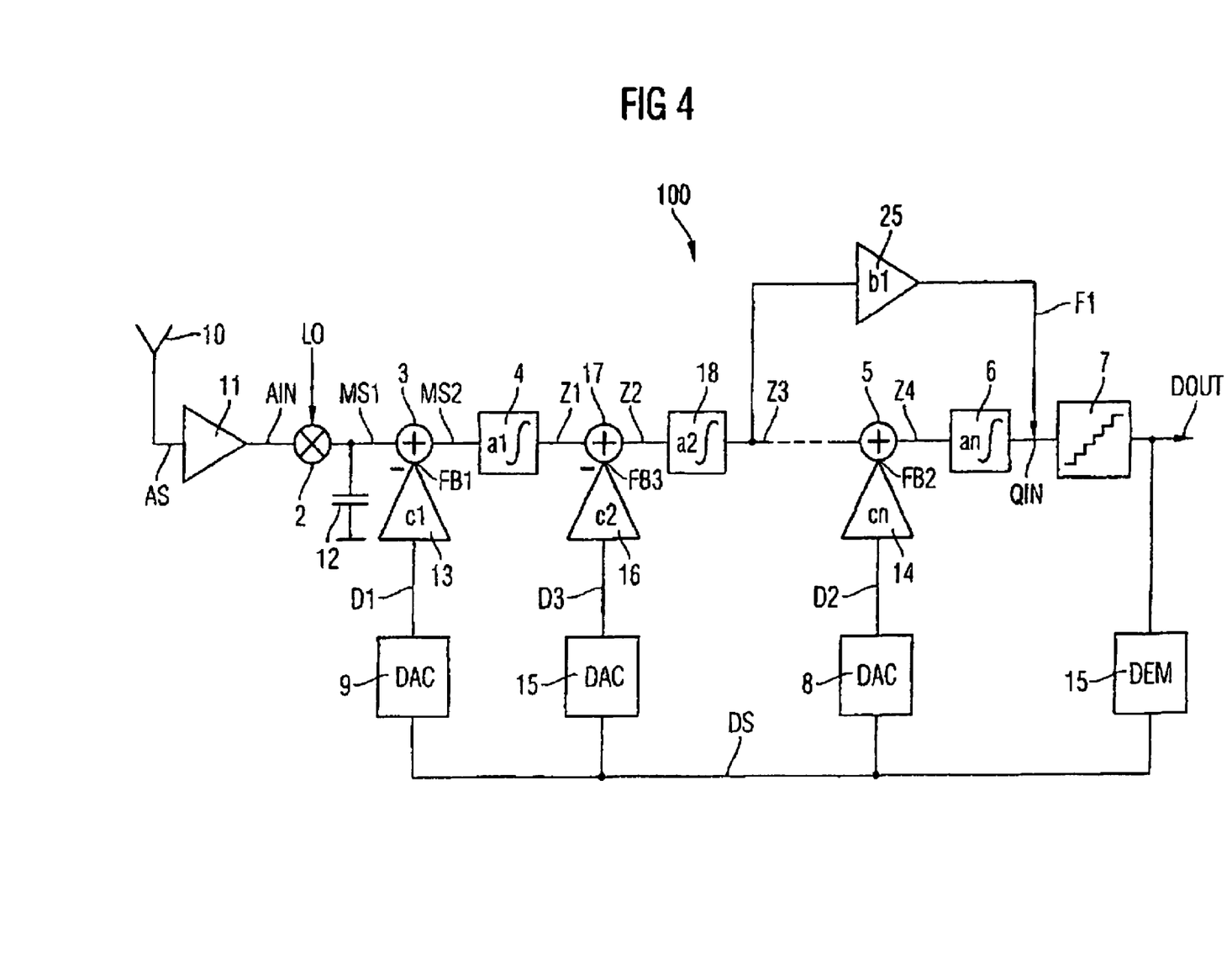
FIG. 4 is a block diagram of an exemplary embodiment of an inventive receiver circuit.

FIG. 4 shows a further illustrative embodiment of the receiver circuit 100 according to the invention. An antenna 10 is provided which delivers an antenna signal AS to a preamplifier 11 which generates the received analog signal AIN. The mixer 2 mixes with the local oscillator frequency LO and supplies the mixer current signal MS1. From the mixer current signal MS1, the first feedback current signal FB1 is subtracted via the adder 3. The current signal MS2 generated is supplied to a first integrator 4 which supplies a first intermediate signal Z1. The first intermediate signal Z1 is supplied to a further integrator 18 which supplies a further intermediate signal Z3. From the intermediate signal Z3, a feedback current signal FB3 is subtracted via the adder device 17 and supplied to a further integrator 18.

The embodiment of the receiver circuit 100 according to the invention, shown in FIG. 4, provides between the first integrator 4 and the second integrator 6 which directly precedes the quantizer 7 further series-connected integrator devices or integrators 18, only one further integrator 18 being drawn here by way of example. Preceding the further integrator 18, an adder 17 is provided which combines the signal Z1 output by the preceding integrator 4 with a respective further feedback current signal FB3, or, respectively, subtracts the feedback current signal FB3 from the signal Z1, and supplies it as signal Z2 to the further integrator 18. The further feedback signal FB3 is generated by a further feedback digital/analog converter 15 and a further weighting device 16.

The weighting devices 14, 13, 16 following the respective feedback digital/analog converters 8, 9, 15 apply a respective weighting factor $c_1$, $c_2$, $c_n$ to the respective analog output signal D1, D2, D3 of the digital/analog converters 8, 9, 15.

The second integrator 6 delivers the quantizer input signal QIN. The quantizer 7 quantizes the quantizer input signal QIN to form the digital output signal DOUT. A feed forward loop which has an amplifier 25 and supplies the output signal Z3 of the integrator 18, weighted with a weighting factor $b_1$, to the quantizer input signal QIN is optionally shown in FIG. 4.

The first feedback current signal FB1 is generated by the first feedback digital/analog converter 9, which is followed by a weighting device 14 which applies a weighting factor to the analog signal delivered by the feedback digital/analog converter 9. Analogously, the second feedback current signal FB2 is generated by a feedback digital/analog converter 8 and a weighting device 16.

A device for dynamic element balancing 15 is provided which subjects the digital output signal DOUT to dynamic element balancing and supplies a corresponding digital signal DS. In digital element balancing, the positions of the signals representing the respective bits in a digital signal present in a thermometer code are regularly exchanged. Since the respective bits in each case control quantizing elements, for example current sources, in the subsequent feedback digital/analog converters 8, 9, 15, all current sources in the digital/analog converters 8, 9 are driven at the same rate on average by exchanging the bit positions in the thermometer code of the digital signal DS. This results in improved linearity of the analog/digital conversion by the sigma/delta modulator.

In the example described, the circuit section implementing the sigma/delta converter comprises the adders 3, 5, 17, the integrators 4, 18, 6, the digital/analog converters 8, 9, 15, the weighting devices 13, 14, 16, the quantizer 7 and the device for dynamic element balancing 15.

The output of the mixer 2 is followed by a decoupling capacitance 12 which decouples any radio-frequency components from the antenna signal AS and the preamplified antenna signal AIN, respectively. The capacitor 12 can also be interpreted to be the parasitic capacitance at the mixer output.

The series-connected integrators 4, 6, 18 in each case have current gains which are shown as gain factors a1, a2 in FIG. 4. With a number of n integrators, a filter order of n is always obtained for a signal which passes from the mixer output to the quantizer 7. It is possible to implement any predetermined filter function by a suitable choice of weighting factors c1, c2, cn and of the gains a1, a2 for inherently forming an adjacent-channel filter for the receiver circuit.

Figure 5:
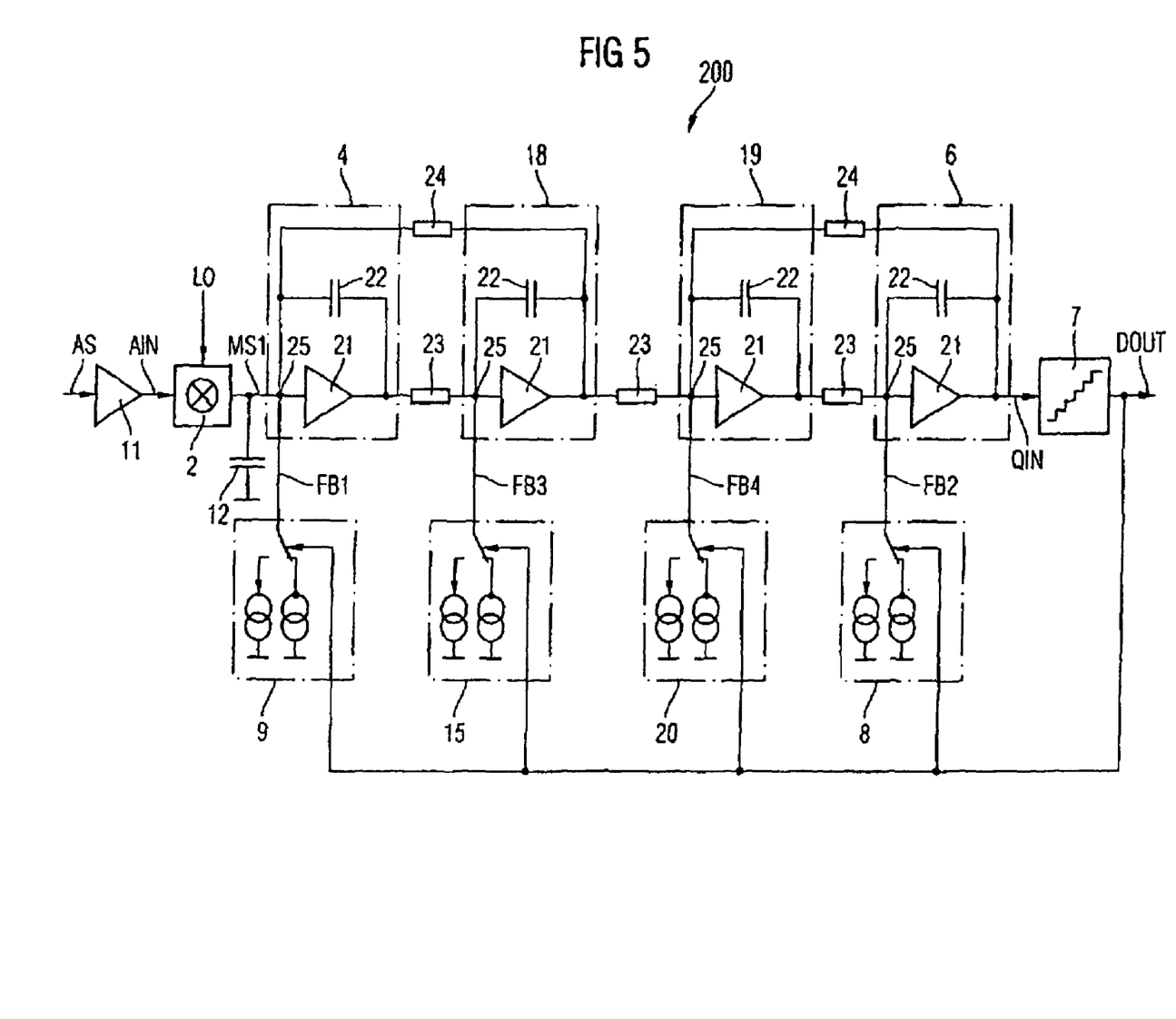
FIG. 5 is a circuit diagram of a further exemplary embodiment of an inventive receiver circuit.

FIG. 5 shows a further illustrative embodiment of the receiver circuit 200 according to the invention. A preamplifier 11 is provided for amplifying an antenna signal AS, a mixer 2 for mixing the preamplified signal AIN with the respective local-oscillator frequency LO, the output of the mixer being followed by a decoupling capacitor 12. The part of the receiver circuit 200 forming a sigma/delta modulator has four series-connected integrators 4, 6, 18, 19 which are in each case constructed of an operational amplifier 21 and a feedback capacitor 22. A particular advantage of using so-called normal operational amplifiers 21 compared with transconductance amplifiers lies in the improved linearity. In this arrangement, the first integrator 4 directly follows the mixer and the second integrator 6 precedes the quantizer 7. Between the integrators 4, 6, 18, 19, resistors 23 are provided.

Feedback digital/analog converters 8, 9, 15, 20 supply respective feedback current signals FB1, FB2, FB3, FB4 from the digital output signal DOUT. The feedback current signals are in each case weighted with weighting factors by choice of the converter elements, for example current sources, provided in the feedback digital/analog converters 8, 9, 15, 20. The feedback current signals FB1, FB2, FB3, FB4 are in each case conducted to line nodes 25 preceding the operational amplifiers 21 of the integrators 4, 6, 18, 19. The input of the first operational amplifier 21 is connected directly to the mixer output at which the mixer current can be picked up.

To form local resonator loops, two integrators are in each case fed back via a resistor 24 in the receiver circuit 200.

The illustrative embodiment of the receiver circuit 200 thus represents a time-continuous fourth-order sigma/delta converter with two local resonators, wherein mixer and analog/digital converter are combined in a circuit arrangement and can be integrated in a simple manner in a semiconductor chip. The implicit adjacent-channel filter is also of fourth order due to the fourth-order arrangement of the sigma-delta converter. The local resonators provide an improved dynamic range of the mixer, sigma/delta analog/digital converter according to the invention or the receiver circuit, respectively.

What is claimed is:

1. A receiver circuit for receiving an analog signal comprising:
    a mixer device which mixes said analog signal with a local-oscillator frequency and outputs a mixer current signal;
    a first integrator device coupled to said mixer device generating a first intermediate signal by integrating said mixer current signal summed with a first feedback current signal;
    a second integrator device following said first integrator device and generating a quantizer input signal by integrating said first intermediate signal summed with a second feedback current signal;
    a quantizer device generating a digital output signal by quantizing said quantizer input signal, wherein said quantizer device receives said quantizer input signal directly from said second integrator, said quantizer input signal being the only input signal to the quantizer device;
    a first feedback digital/analog converter which converts said digital output signal into said first feedback current signal; and
    a second feedback digital/analog converter converting said digital output signal into said second feedback current signal,
    wherein said first and second integrator devices are constructed of an operational amplifier and a feedback capacitor;
    wherein at least one local resonator loop is formed and at least two serially interconnected integrator devices are provided with feedback via a resistor.

2. The receiver circuit of claim 1, wherein at least one of said first or second feedback digital/analog converters is followed by a weighting device which weights the relevant feedback signal of said first or second feedback signals with a weighting factor.

3. The receiver circuit of claim 2, wherein said weighting factor is adjusted in such a manner that said receiver circuit performs a predetermined filtering of said analog signal.

4. The receiver circuit of claim 1, further comprising at least one further integrator device and at least one further associated feedback digital/analog converter; wherein said at least one further integrator devices is connected serially between said first integrator device and said second integrator device and integrates an associated further feedback current signal summed with an intermediate signal generated by an integrator device preceding said further integrator device; said further feedback current signal being generated by said further associated feedback digital/analog converter from said digital output signal.

5. The receiver circuit of claim 4, further comprising a further weighting device following said further digital/analog converter.

6. The receiver circuit of claim 1, wherein at least one feed forward loop with a feed forward weighting device is provided; said feed forward weighting device weighting an intermediate signal of an integrator device and said weighted intermediate signal is added to the quantizer input signal.

7. The receiver circuit of claim 1, wherein said quantizer device and said first and second feedback digital/analog converters are arranged as multi-bit quantizer and multi-bit digital/analog converter.

8. The receiver circuit of claim 1, wherein said mixer device is preceded by a preamplifier which amplifies said analog signal.

9. The receiver circuit of claim 8, wherein said preamplifier is preceded by a receiving means or an antenna.

10. The receiver circuit of claim 1, wherein a device for dynamic element balancing precedes at least one of said first or second feedback digital/analog converters.

11. The receiver circuit of claim 1, further comprising a filter device for generating a filtered quantizer input signal by filtering said quantizer input signal, wherein said filtered quantizer input signal is fed to said quantizer device.

12. The receiver circuit of claim 11, wherein said filter device is an integrator.

13. An arrangement configured to receive an analog signal comprising:
- a mixer device configured to mix the analog signal with a local-oscillator frequency and to output a mixer current signal;
- a quantizer device configured to generate a digital output signal by quantizing a quantizer input signal;
- one or more signal paths between the mixer device and quantizer device, at least a first signal path configured to generate the quantizer input signal, each of the one or more signal paths configured to provide at least second order filtering; and
- a first feedback digital/analog converter configured to convert the digital output signal into the first feedback current signal; and
- a second feedback digital/analog converter configured to convert the digital output signal into the second feedback current signal;
- wherein the first signal paths includes a first integrator device coupled to receive the mixer current signal summed with a first feedback current signal; and a second integrator device coupled to receive an output of the first integrator device summed with a second feedback current signal and to generate the quantizer input signal based on the output of the first integrator device summed with the second feedback current signal, and
- wherein the quantizer device receives the quantizer input signal directly from the second integrator, the quantizer input signal being the only input signal to the quantizer device,
- wherein said first and second integrator devices are constructed of an operational amplifier and a feedback capacitor; and
- wherein at least one local resonator loop is formed and at least two serially interconnected integrator devices are provided with feedback via a resistor.

14. The arrangement of claim 13, further comprising at least one feed forward loop with a feed forward weighting device, said feed forward weighting device configured to weight an intermediate signal of an integrator device; and wherein the weighted intermediate signal is added to the quantizer input signal.

15. The arrangement of claim 13, wherein at least one signal path includes a plurality of integrators, each integrator operably coupled to an output of the quantizer via one of a plurality of digital/analog conversion devices.

* * * * *